United States Patent [19]
Yoshitake

[11] Patent Number: 4,607,274
[45] Date of Patent: Aug. 19, 1986

[54] COMPLEMENTARY MOS FIELD EFFECT TRANSISTOR INTEGRATED CIRCUIT WITH PROTECTION FUNCTION

[75] Inventor: Kazuki Yoshitake, Tokyo, Japan

[73] Assignee: NEC Corporation, Tokyo, Japan

[21] Appl. No.: 542,369

[22] Filed: Oct. 17, 1983

[30] Foreign Application Priority Data

Oct. 15, 1982 [JP] Japan .............................. 57-181111
Dec. 17, 1982 [JP] Japan .............................. 57-221215

[51] Int. Cl.⁴ ...................... H01L 27/02; H01L 29/90
[52] U.S. Cl. ...................................... 357/42; 357/41; 357/13
[58] Field of Search .............................. 357/42, 41, 13

[56] References Cited

U.S. PATENT DOCUMENTS 4,006,491 2/1977 Alaspa et al. ........................ 357/42

Primary Examiner—Martin H. Edlow
Assistant Examiner—Terri M. Henn
Attorney, Agent, or Firm—Laff, Whitesel, Conte & Saret

[57] ABSTRACT

This invention provides a structure for preventing input part and/or an output part of the semiconductor chip forming complementary MOS field effect transistors from being damaged by accumulated static charges, wherein regions of the conductivity types as and higher impurity concentrations than a semiconductor substrate and a well region, respectively, are formed at the respective surfaces to come in contact with each other such that diodes be formed and the diodes are connected to an electrode pad.

1 Claim, 8 Drawing Figures

COMPLEMENTARY MOS FIELD EFFECT TRANSISTOR INTEGRATED CIRCUIT WITH PROTECTION FUNCTION

BACKGROUND OF THE INVENTION

This invention relates to a structure of a semiconductor integrated circuit in which MOS field effect transistors of the complementary type are integrated.

The semiconductor integrated circuit of complementary type MOS field effect transistors has such a structure that a P-type well region is formed in an N-type silicon substrate with N-channel MOS field effect transistors (hereinafter referred to as "N-MOS FETs") formed in the P-type well region and P-channel MOS field effect transistors (hereinafter referred to as "P-MOS FETs") formed in the N-type silicon substrate. The gate electrodes and the drain electrodes of a P-MOS FET and an N-MOS FET are connected in common, respectively, to form and inverter circuit. A supply voltage is applied between the source electrodes of the two FETs. The common gate electrode receives an input signal of the inverter, and the inverter output is derived from the common drain electrodes. Where the inverter circuit is employed as an input buffer amplifier, the common gate electrode of the inverter circuit is connected to an input terminal provided on an integrated circuit chip. Where the inverter circuit is used as an output amplifier, an output terminal provided on the integrated circuit chip is connected to the common drain electrodes of the inverter circuit. When the integrated circuit chip is being not practically used, for example, in storage, static charges are often accumulated on the input terminal and/or the output terminal of the chip. If a part of the chip happens to touch a ground potential, the accumulated static charges flow to the ground, and thus the gate insulating films of the MOSFETs of the input inverter buffer is destroyed or a PN-junction between the drain region of the P-MOS FET and the substrate or between the drain of the N-MOS FET and the P-well region is destroyed in the output amplifier.

To protect the gate insulating films and the PN junction from being destroyed, respective opposite conductivity type regions are formed in the N-type silicon substrate and in the P-well region and connected to the input or output terminal to work as two protective diodes. The two protective diodes are practically connected in series between two power terminals. If the static charges are accumulated on the input terminal or the output terminal and either one of the power terminals is touched to a ground potential, a discharge current flows through either one of the protective diodes. Thus, MOS field effect transistor can be protected from being destroyed.

However, large junction areas cannot be taken for the protective diodes formed in the N-type silicon substrate and the P-well region. Therefore, their current capacities are small. Consequently, the protective diode comes to be destroyed by the static charges accumulated to some degree or over, and thus the integrated circuit itself becomes of no use.

Further, a high impurity concentration region is usually prepared as a channel stopper region at the surface of the N-type silicon substrate and the P-well region to prevent an inducement of a parasitic conductive channel at the surface of the substrate. The high impurity region is normally formed shallower than source and drain regions of the FET's through another diffusion process. Therefore, if the opposite conductivity type regions of the protective diodes and the source and drain regions of the FET's are formed concurrently, there still required is an impurity diffusion process for the channel stopper region.

SUMMARY OF THE INVENTION

An object of this invention is to obtain an integrated circuit having complementary MOS field effect transistors together with protective elements large in current capacity.

Another object of this invention is to obtain an integrated circuit having complementary MOS field effect transistor together with a protective element against accumulated static charges, which is easy to be manufactured.

This invention is characterized in that a PN junction diode low in breakdown voltage is provided in parallel with a PN junction between a substrate and a well region in addition to the conventional protective diodes. This supplementary protective diode can be formed by bringing a high impurity concentration layer of the same conductivity type as the well region formed at the surface of the well region into contact with a high impurity concentration layer of the same conductivity type as the substrate formed at the surface of the substrate.

According to one aspect of this invention, an integrated circuit comprises a semiconductor substrate of one conductivity type, a well region of another conductivity type which is formed in the semiconductor substrate, first and second regions of the other conductivity type formed at the surface of the substrate and working as a source and a drain of a field effect transistor of a first channel type, a first gate region between the first and the second regions, third and fourth regions of the one conductivity type formed in the well region and working as a source and drain of a field effect transistor of a second channel type, a second gate region between the third and the fourth regions, a fifth region of the other conductivity type having an impurity concentration higher than the well region, the fifth region being formed at the surface area of the well region except for the area of the second channel type field effect transistor in contact with at least one of the third and the fourth regions, and a sixth region of the one conductivity type having an impurity concentration higher than the semiconductor substrate, the sixth region being formed at the semiconductor substrate surface so as to come in contact with both of the fifth region and at least one of the first and the second regions.

An inverter circuit operating as an output amplifier can be constituted by connecting the mentioned one of the first and the second regions of the first channel type field transistor and the mentioned one of the third and the fourth regions of the second channel type field effect transistor in common to an output terminal, connecting the other of the first and the second regions and the substrate to an one of power terminals, and further by connecting the other of the third and the fourth regions and the well regions to the other power terminal. When static charges accumulated on the output terminal are discharged to an either one of the power terminals which happens to become a grounded state, a PN junction diode between the fifth and the sixth regions works as a by-passing route for the discharge current in parallel with a diodes between the one of the first and second regions and the substrate or a diode between the one of the third and fourth regions and the well region. Therefore, the PN junctions and the gate insulating films of FETs of the output amplifier can be protected from being destroyed. More specifically, the PN junctions between the two regions connected to the output terminal and the substrate and the well regions are connected between the output terminal and the respective power terminals and work as protective diodes which are equivalent to the conventional protective diodes of a low breakdown voltage. In addition to these conventional protective diodes, the new PN junction diode having a low breakdown voltage is formed of the fifth and the sixth regions of the high impurity concentration between the two power terminals. Consequently, the static charges accumulated on the output terminal are discharged from the output terminal to one of the power terminals which happens to be grounded (note that the other power terminal is in a floating state) by way of either one of the forward junction and the reverse junction of the low breakdown voltage of one of the conventional protective diodes and at the same time discharged easily by way of the reverse junction or the forward junction of the other conventional protective diode and the forward junction or the reverse junction of the low breakdown voltage of the protective diode according to this invention. Therefore, a current capacity of the protective routes is enhanced and the discharge current can flow without destroying a junction of any protective diodes.

The above first, second and fifth regions can be formed in the same process, and third, fourth and sixth regions can also be formed in the same process, thereby eliminating an increase in the manufacturing process. In this case, the regions formed in the same process are almost same in depth. Since the respective regions are formed to come in contact with adjacent regions, the area occupied by FET's and the protective diodes will not increase for the new protection function. Furthermore, the fifth and the sixth regions also act as channel stoppers for preventing the formation of surface inversion layers. It is favorable for the purpose of channel stoppers that the surface area where a parasitic channel is capable of arising between the transistors will be filled with the fifth region at the surface of the well region and with the sixth region at the surface of the substrate.

According to another aspect of the present invention, an integrated circuit comprises a semiconductor substrate of one conductivity type, a well region of the other conductivity type formed in the semiconductor substrate, a first region of the other conductivity type formed in the semiconductor substrate and working as a first protective diode region, a second and third regions formed in the semiconductor substrate and working as a source and a drain of a field effect transistor of a first channel type, a first gate electrode on an area between the second and the third regions, a fourth region of the one conductivity type formed in the well region and working as a second protective diode region, fifth and sixth regions of the one conductivity type formed in the well region and working as a source and a drain of a field effect transistor of a second channel type, a second gate electrode on area between the fifth and the sixth regions, an input terminal connected to the first and the fourth regions, a wiring for interconnecting the first region and the first and the second gate electrodes, a seventh region of the one conductivity type having an impurity concentration higher than the semiconductor substrate and formed at the semiconductor substrate surface in contact with the first region, and an eighth region of the other conductivity type having an impurity concentration higher than the well region, and formed of the surface of the well region in contact with the fourth region, the eighth region being further in contact with the seventh region to form a third protective diode having a low breakdown voltage therebetween.

The static charges accumulated on the input terminal can be discharged without humperring the first, second and third protective diodes according to this aspect of the invention. For example, when the static charges accumulated on the input terminal are discharged to the semiconductor substrate which happens to take a ground potential due to sudden and unexpected contact with an external ground potential body, there exist two paths for the discharging current by way of a junction in the forward direction of the first protective diode (if the accumulated charges are positive, and the one conductivity type is N type) or a PN junction having a low breakdown voltage in the reverse direction of the first protective diode (if the one conductivity type is P type) and by way of a PN junction having a low breakdown voltage in the reverse direction or the PN junction in the forward direction of the second protective diode and a PN junction in the forward direction on the PN junction having a low breakdown voltage in the reverse direction of the third protective diode. When the well region happens to take the ground potential, the static charges accumulated on the input terminal are discharged to the well region by way of the reverse junction having a low breakdown voltage or the forward junction of the second protective diode and also discharged to the well region by way of the forward junction or the reverse junction of the first protective diode and a reverse junction having a low breakdown voltage or a forward junction of the third protective diode. Thus, the discharge current passage is doubled to enlarge a current capacity. Therefore, the static charges accumulated on the input terminal can be discharged safely without humperring junctions of the protective diodes. The first, second, third and eighth regions and the fourth, fifth, sixth and seventh regions can be formed in the same processes to the same depthes, thus preventing increase in the manufacturing processes. The first, seventh, eighth and fourth regions are kept in contact with each other, and therefore the protective diodes do not inverse an area of the semiconductor substrate. The seventh and eighth regions also have a function of preventing formation of surface inversion layers, needless to say. It is, therefore, favorable that the seventh region is brought into contact with the second and third regions and provided on the surface area entirely at a portion where the inversion layer is apt to be formed, and the eighth region is brought into contact with the fifth and sixth regions and provided entirely on the surface area of the well region at a portion where the inversion layer is apt to be formed.

BRIEF DESCRIPTION OF THE DRAWINGS

The above and further objects, features and advantages of the present invention will become more apparent from the following detailed description of embodiments taken in conjunction with the accompanying drawings, wherein:

FIG. 1 (b) is an equivalent circuit diagram of a conventional integrated circuit provided with an input protective device;

FIG. 2 (b) is a plan view of an integrated circuit in which the circuit of FIG. 2 (a) is realized; FIG. 2 (c) is a sectional view taken along the line A–A' of FIG. 2 (b);

FIG. 3 (b) is a plan view of an integrated circuit in which the circuit of FIG. 3 (a) is realized; and FIG. 3 (c) is a sectional view taken along the line B–B' of FIG. 3 (b).

DETAILED DESCRIPTION OF THE INVENTION

To obtain a complementary field effect integrated circuit (hereinafter referred to as "C-MOS IC") in which complementary MOS field effect transistors are integrated in a semiconductor substrate, a P-type well region having a low impurity concentration is formed in an N-type silicon substrate also having a low impurity concentration. Source and drain regions of P-MOS FETs are formed by diffusing a P-type impurity in high density in the N-type silicon substrate. Source and drain regions of N-MOS FETs are formed by diffusing N-type impurities in high density in the P-type well region. The P-MOS FETs and N-MOS FETs are connected to form a desired circuit.

Figure 1A:
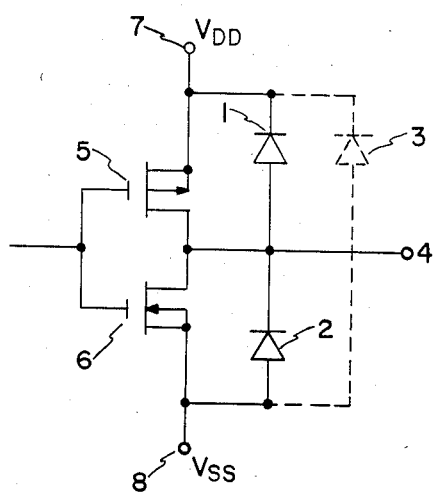
FIG. 1 (a) is an equivalent circuit diagram of a conventional integrated circuit with complementary field effect transistors provided with an output protective device.
Figure 1B:
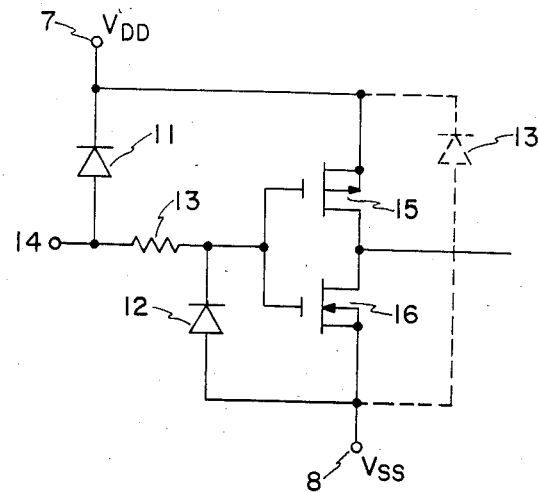

To prevent the gate oxide films of the MOS FETs from being destroyed between the drain regions and the gate electrodes by static charges accumulated on an output terminal of the C-MOS IC, measures have been adopted in the prior art as shown in FIG. 1 (a). A diode 1 is provided between an output terminal 4 and a power supply terminal 7 of a voltage $V_{DD}$, and another diode 2 in also provided between the output terminal 4 and another power supply terminal 8 of a voltage $V_{SS}$. The diode 1 is formed by diffusing P-type impurities into the N-type silicon substrate, and the diode 2 is formed by diffusing N-type impurities into the P-type well region. However, junction areas of these diodes 1 and 2 are not large enough. A diode 3 which is formed by a PN junction between the P-type well region and the N-type substrate can contribute to safely discharge the static charges accumulated on the output terminal 4 only when the discharge current flows through its PN junction in the forward direction. Therefore, when the accumulated positive charges are discharged to the terminal 7, both the two diodes 1 and 2 can be used for discharge current paths which consist of a path from the terminal 4 via the PN junction in the forward direction of the diode 1 to the terminal 7 and a path from the terminal 4 via the PN junction in the reverse direction of the diode 2 and the PN junction in the forward direction of the diode 3 to the terminal 7. In contrast to the low breakdown voltage of the diode 2, the diode 3 has a very high breakdown voltage, because the well region and the substrate which form the PN junction of the diode 3 have both low impurity concentrations. Therefore, the PN junction in the reverse direction of the diode 3 does not allow the discharge current to flow therethrough. In consequence, when the terminal 8 happens to become a ground state, the positive charges accumulated on the output terminal 4 are discharged to the terminal 8 by way only of the PN junction in the reverse direction of the diode 2. When negative charges are accumulated on the output terminal and the terminal 7 happens to take the ground potential, the discharge current flows only through the PN junction in the reverse direction of the diode 1. Since a current capacity of a single diode is not enough, the protective diode 1 or 2 is often destroyed by the discharge current when the path of the discharge current in single.

The low impurity concentrations of the N-type silicon substrate and the P-type well region bring about another problem in that surface inversion layers are easily formed at their surfaces and an undesirable conductive channel due to the surface inversion layer is apt to be formed between circuit elements. For prevention, highly-doped channel-stopper regions are formed shallowly at the surface of the N-type silicon substrate and the P-type well region in such manner as will not overlap with the MOS FETs and the protective diodes. Consequently, an impurity diffusion processes for forming the channel stopper regions are necessary in addition to the diffusion process for forming the MOS FETs and the diodes, and surface area of the C-MOS IC must be increased.

Similar problems have been also present on a C-MOS IC provided with an input protective device. As shown in FIG. 1 (b), in this case, gate electrodes of a P-MOS FET 15 formed in the N-type silicon substrate and an N-MOS FET 16 formed in the P-type well region are connected to an input terminal 14 by way of a resistor 13 which is comprised of a P-type diffusion region formed in the N-type silicon substrate. A PN-junction formed of the P-type diffusion region of the resistor 13 and the N-type silicon substrate is inserted between the input terminal 14 and the power terminal 7 as a protective diode 11. In addition, an N-type region is formed in the P-type well region to form a protective diode 12 inserted between the gate electrodes connected in common and the power terminal 8. The PN junction 13 between the well region and the substrate contributes to the protecting action in its forward junction only, as mentioned before.

In such input protective device, the positive charges accumulated on the input terminal 14 are discharged through the diode 12 only as a discharge passage when the terminal 8 comes to a grounded state. Since the diode 12 has not a sufficient current capacity, its junction is often destroyed.

Figure 2A:
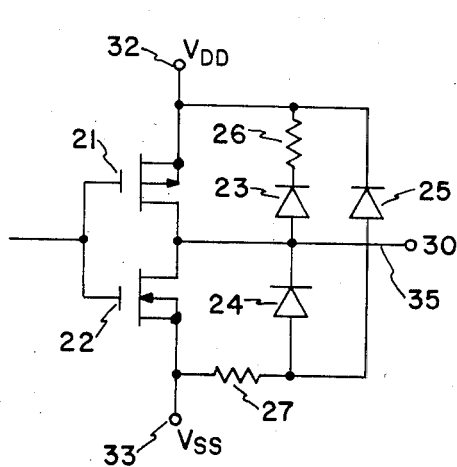
FIG. 2 (a) is an equivalent circuit diagram of an integrated circuit provided with an output protective device according to a first embodiment of this invention.
Figure 2B:
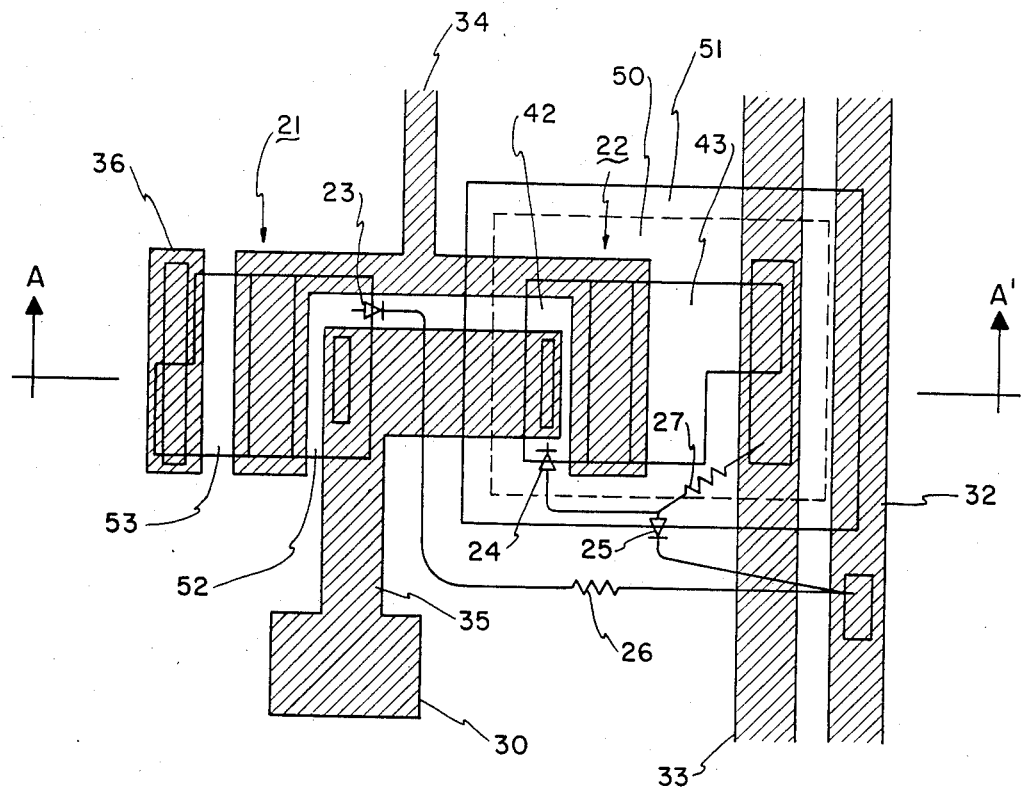
Figure 2C:
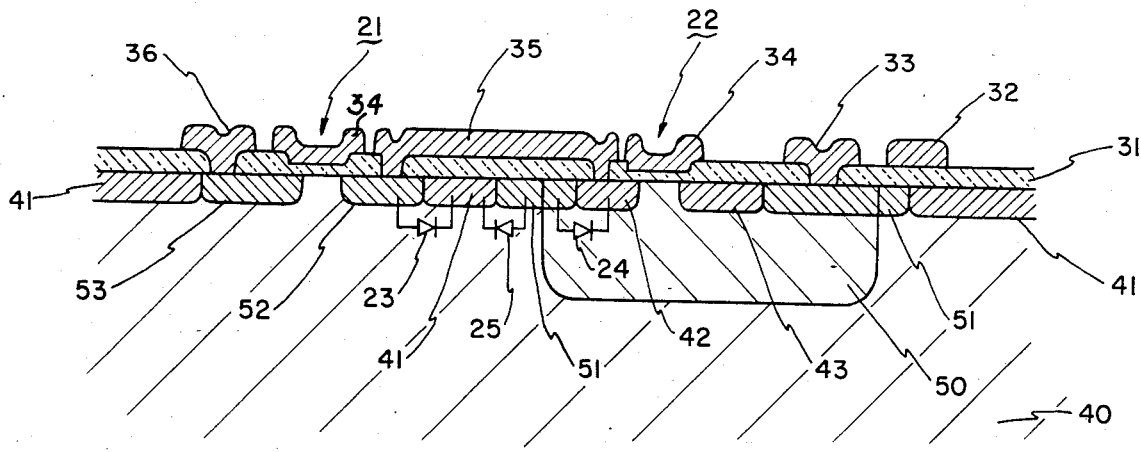

Referring now to FIGS. 2(a), 2(b) and 2(c) which illustrate the first embodiment of this invention, a P-type well region 50 having an acceptor concentration of $10^{16}$ cm$^{-3}$ and a depth of 5 to 7 μm is formed by ion implantation in an N-type silicon substrate 40 having a donor concentration of $10^{15}$ cm$^{-3}$. Holes are opened in a silicon oxide film on the surface, which work as a diffusion mask, and then phosphorus is diffused though the holes to form N+ regions 41, 42, 43 having an impurity concentration of $10^{20}$ cm$^{-3}$ and a depth of 2 μm. The N+ regions 42 and 43 work as drain and source regions of an N-MOS FET 22. The N+ region 41 is a cathode region of protective diodes as well as a channel stopper region for preventing a formation of a P-type inversion layer on the surface of the N-type silicon substrate 40. Next, boron is diffused at $10^{19}$ cm$^{-3}$ in impurity concentration and 1.3 μm in depth to form P+ regions 51, 52 and 53. The P+ regions 52 and 53 are drain and source regions of a P-MOS FET 21. The P+ region 51 is an anode region of protective diodes as well as a channel stopper region for the P well region 50. The N+ region 41 and the P+ region 51 are disposed so as to come in contact with each other to form a PN junction therebetween and also to come in contact with the source and drain regions 53, 52 and 43, 42 of different conductivity types to form PN junctions therebetween. The P+ region 51 is formed at the surface of the P-type well region 50 entirely except the N+ regions 42 and 43 and a channel region between them and further formed to extend beyond the P-type well region 50. The N+ region 41 is formed at the surface of the N-type silicon substrate in the area excluding the P+ regions 52 and 53, a channel region between them, P+ regions of other P-MOS FETs (not illustrated) and the P+ region 51. A silicon oxide film 31 of 6,000 to 8,000 Å thick is formed on the surface of the substrate 40. The oxide film 31 is given at about 700 Å on the channel regions of the MOS FETs 21 and 22. The oxide film 31 has holes at necessary portions for electrodes to contact with the respective regions 41 to 43 and 51 to 53. Aluminum is evaporated on the entire surface and then etched to a predetermined shape to form wiring layers 32, 33, 34, 35 and 36. The wiring layer 32 is a power supply line for voltage $V_{DD}$ connected to the N-type silicon substrate 40 through the N+ region 41. The wiring layer 33 is a power supply line for voltage $V_{SS}$ which is connected to the P-type well region 50 through the P+ region 51 and also to the N+ source region 43 of the N-MOS FET 22. The wiring layer 34 forms a gate electrode of the N-MOS FET 22 and a gate electrode of the P-MOS FET 21 and interconnects these gate electrodes to receive an input signal. The wiring layer 35 connects the N+ drain region 42 of the N-MOS FET 22 and the P+ drain region 52 of the P-MOS FET 21 to an output terminal 30. The wiring layer 36 connects the P+ source region 53 of the P-MOS FET 21 to the N-type silicon substrate 40 through the N+ region 41.

A first protective diode 23 is formed of a PN junction between the P+ region 52 and the N+ region 41. A portion of the N+ region 41 between the PN junction of the diode 23 and a contact of the wiring layer 32 to the N+ region 41 works as a parasitic resistance 26. A second protective diode 24 is formed of a PN junction between the P+ region 51 and the N+ region 42. A third protective diode 25 is formed of a PN junction between the P+ region 51 and the N+ region 41. A PN junction between the P-type well region 50 and the N-type silicon substrate 40 is present in parallel with the PN junction of the third protective diode 25, but its breakdown voltage is as high as 30 to 40 V and it is not serviceable to the protective action in its reverse direction. Both the second and third protective diodes 24 and 25 use the P+ region 51 as an anode and are connected to the wiring layer 33 through the P+ region 51 by way of a parasitic resistance 27 caused by the P+ region 51.

When the C-MOS IC is out of operation, i.e. none of the supply voltages $V_{DD}$ and $V_{SS}$ is supplied thereto and no input signal is applied, positive static charges may be accumulated on the output terminal 30. Assume that the wiring layer 32 happens to touch an object of ground potential to come to a grounded state. Then, the accumulated charges are discharged from the output terminal 30 to the line 32, through two paths. A first discharge path is by way of the forward junction of the first protective diode 23 and the parasitic resistance 26. Forward voltages of the first, second and third protective diodes are about 0.7 V. Therefore, a voltage between the output terminal 30 and the wiring layer 32 comes in the sum of the 0.7 V and the value of a voltage drop across the parasitic resistance 26. A second discharge path is via the PN junction in the reverse direction of the second protective diode 24 and the PN junction in the forward direction of the third protective diode 25. The withstand voltage or breakdown voltage of the PN junction in the reverse direction of the first, second and third protective diodes is 6.5 to 7 V, because these diodes are formed of high impurity concentration regions. Therefore, the discharge starts at a voltage 0.7 V plus 6.5 to 7 V in the second path. On the other hand, when the wiring 32 is kept floating and the wiring 33 comes to a grounded state, the positive charges accumulated on the output terminal 30 are discharged by way of the PN junction in the reverse direction of the second protective diode 24 and also discharged by way of the junction in the forward direction of the first protective diode 23 and the PN junction in the reverse direction of the third protective diode 25. Thus, the charges are discharged through the two paths at all times as described, and therefore an appreciable quantity of charges can be discharged safely. When negative charges are accumulated, they can also be discharged through the two discharge paths. Junction areas of the three protective diodes 23, 24, and 25, particularly a junction area of the third protective diode 25, are exceedingly large, and a current capacity is very large accordingly. Therefore, such protective device is capable of withstanding thoroughly against a large current.

Further, the N+ region 41 and the P+ region 51 function as channel stoppers for preventing formation of surface inversion layers. Since these N+ region 41 and P+ region 51 function as the protective diodes and the channel stoppers at the same time, a reduction of the element area can be attained reasonably as compared with the conventional structure wherein they are fabricated separately from each other. Besides, both N+ region 41 and P+ region 51 are fabricated in the same diffusion process as the N+ regions 42, 43 and the P+ regions 52, 53, and therefore no further manufacturing process is necessary.

Next, a C-MOS IC provided with an input protective device given in another embodiment of this invention will be described with reference to FIGS. 3(a), 3(b) and 3(c). A P-type well region 150 having an impurity concentration of $10^{16}$ cm$^{-3}$ and a depth of 5 to 7 μm is formed in an N-type silicon substrate 140 having an impurity concentration of $10^{15}$ cm$^{-3}$. With a surface silicon oxide film as a diffusion mask, N-type impurities are diffused to $10^{20}$ cm$^{-3}$ in concentration to form N+ regions 141, 142, 143 and 163 having a depth of 2 μm. The N+ region 142 is a drain region of an N-MOS FET 122, and the N+ region 143 is a source region. The N+ region 163 forms a second protective diode 124 which is a part of the input protective device. Next, P-type impurities are diffused to $10^{19}$ cm$^{-3}$ in concentration to form P+ regions 151, 152, 153 and 162′ having a depth of 1.3 μm. The P+ regions 152 and 153 are a drain region and a source region, respectively, of a P-MOS FET 121. The P+ region 162′ forms an input protective resistor 162, and its PN junction also constitutes a first protective diode 123. The N+ region 141 and the P+ region 151 are formed on all the surface areas of the substrate 140 and the P-type well region 150, respectively, except the element regions such as MOS FETs 121 and 122, input protective resistor 162, input protective diode region 163 and the like, for preventing formation of the surface inversion channels. The P+ region 151 is formed at the surface of the P-type well region 150 and is particularly formed to come out to the N-type silicon substrate 140 in the periphery of the P-type well region 150. The N+ region 141 is contacted with the P+ region 151 to form a PN junction of a third protective diode 125 having a low breakdown voltage. Both the regions 141 and 151 contact with adjacent high impurity concentration regions, i.e. the regions 152, 153, 162', 142, 143, and 163.

The silicon oxide film used as an impurity diffusion mask may be used straight for a silicon oxide film 131 for passivation. However, the silicon oxide film 131 will preferably be newly formed at a thickness of 6,000 to 8,000 Å after the silicon oxide film used as a diffusion mask is removed. A portion between the drain region 142 and the source region 143 of the silicon oxide film 131 and a portion between the drain region 152 and the source region 153 are removed once, and then a gate oxide film of about 700 Å in thickness is formed by a heat treatment in an oxidizing atmosphere.

Next, the silicon oxide film 131 is removed selectively to form contact holes for the electrode wirings. Then, aluminum is evaporated on the whole surface, and the aluminum is removed through etching selectively to form metal wiring layers 132, 133, 134, 135, 136 and 164 and an input terminal pad 161.

Figure 3A:
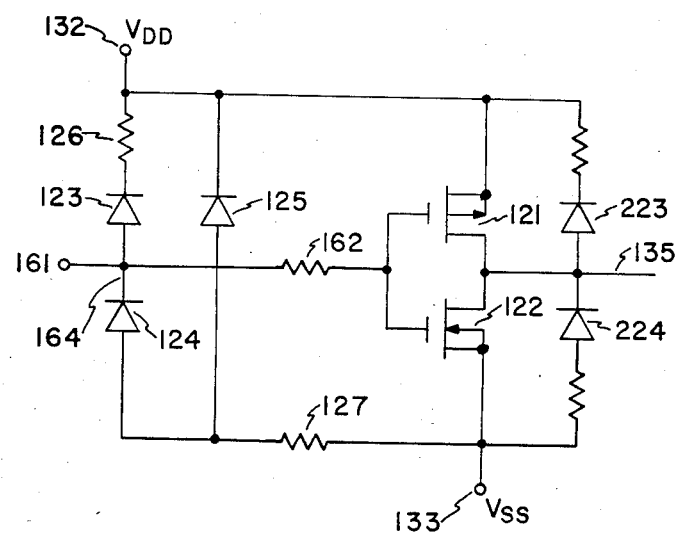
FIG. 3 (a) is an equivalent circuit diagram of an integrated circuit provided with an input protective device according to a second embodiment of this invention.
Figure 3B:
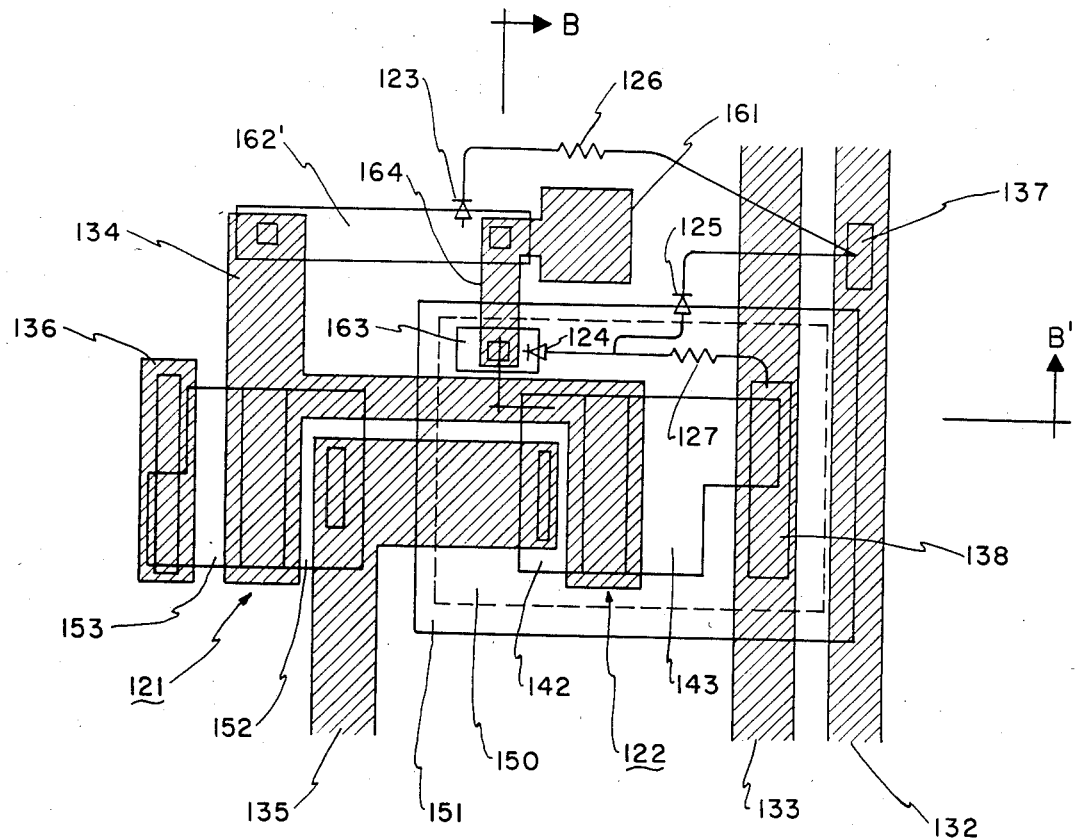
Figure 3C:
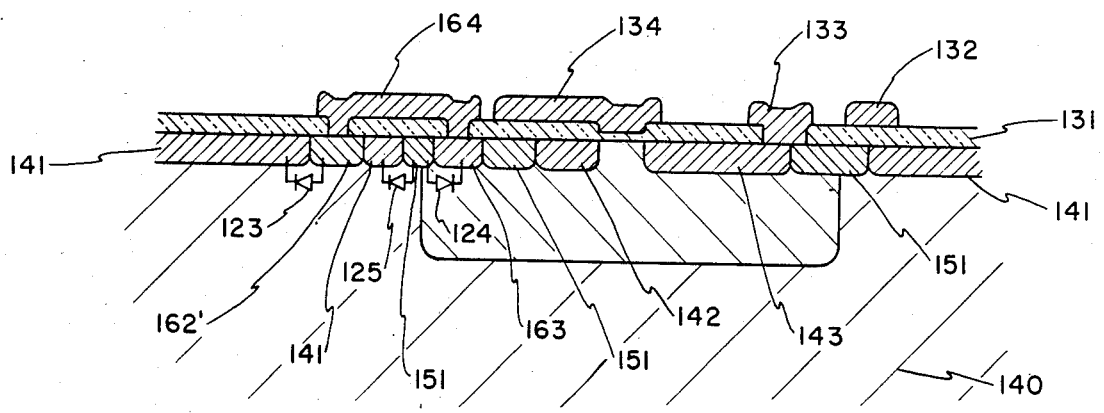

The semiconductor device constituted as above forms an equivalent circuit like FIG. 3(a). A signal supplied to the input terminal 161 is applied to the gates of the P-MOS FET 121 and the N-MOS FET 122 through the input protective resistor 162. The P+ region 162' constituting the input protective resistor 162 comes in contact with the N+ region 141 to form the first protective diode 123. The N+ region 141 is linked with a power supply line 132 to receive the supply voltage $V_{DD}$ through a contact hole 137, and therefore a series connection of the first protective diode 123 and the parasitic resistance 126 is interposed between the input terminal 161 and the power supply line 132. The wiring layer 164 is connected with the input terminal 161 and also connected to the N+ region 163 in the P-type well region 150. The N+ region 163 is adjacent with the P+ region 151 to form the second protective diode 124, and the P+ region 151 is connected with a power supply line 133 to receive the supply voltage $V_{DD}$ through the contact hole 138. Consequently, the second protective diode 124 and the parasitic resistance 127 are connected in series between the input terminal 161 and the power supply 133. Further, the P+ region 151 is kept in contact with the N+ region 141, and therefore the third protective diode 125 is connected between the two power supply lines 132 and 133. The third protective diode 125 is large both in the junction area and the current capacity. Since the input protective diodes 123, 124, and 125 are all formed between the high impurity concentration regions, their breakdown voltages are low at 6.5 to 7 V. Diodes 223 and 224 are formed, similar to the first embodiment, between the output line 135 of the inverter circuit and the substrate 140 and the well region 150.

When the C-MOS IC is out of service, i.e. the supply voltages $V_{DD}$ and $V_{SS}$ are not impressed, and the power supply line 132 happens to become a ground potential, positive static charges accumulated on the input terminal 161 are discharged to the power supply line 132. The discharge current flows through the forward junction of the first protective diode 123 and the parasitic resistance 126 to the line 132 when the voltage at the input terminal 161 exceeds the sum of a forward voltage 0.7 V of the first protective diode 123 and a value of voltage drop across the parasitic resistance 126. The discharge current also flows through the second protective diode 124 in the reverse direction and the third input protective diode 125 in the forward direction, if the voltage at the input terminal 161 is higher than the sum of the breakdown voltage of the second input protective diode 124, i.e. 6.5 to 7 V, and the forward voltage of 0.7 V of the diode 125. On the other hand, if the power supply line 133 happens to come to a grounded state, the static charges accumulated on the input terminal 161 are discharged through the PN junction in the reverse direction of the second protective diode 124 and the parasitic resistance 127 and also discharged to the power line 133 through the forward junction of the first protective diode 123, the parasitic resistance 126, the reverse junction of the third protective diode 125 and the parasitic resistance 127. When the output line 135 happens to become a grounded state, the accumulated charges are discharged by way of the diodes 123 and 223 and by way of the diodes 124 and 224. Thus, there alway exist at least two discharge paths. Therefore, a current capacity of the input protective device is large, and the PN junctions of the protective diodes 123 and 124 will never be destroyed by the static charges accumulated on the input terminal.

The N+ regions 141 and 163 are formed simultaneously with the drain and source regions 142 and 143 of the N-MOS FET 122. The P+ regions 151 and 162' are also formed simultaneously with the drain and source regions 152, 153 of the P-MOS FET. Therefore no increase will be brought on the manufacturing process such as diffusion process. Both N+ region 141 and P+ region 151 can be formed in contact with or in duplication with adjacent region, therefore no allowance will have to be provided to prevent an overlap of diffusion regions at the time of impurity diffusion, thus attaining a reduction of the area for forming the C-MOS IC.

This invention is not necessarily limited to the embodiments described above. For example, circuit design formed of P-MOS FET and N-MOS FET can be constituted arbitrarily. Further, provided that the N+ regions 41, 141 on the surface of N-type semiconductor substrates 40, 140 and the P+ regions 51, 151 on the surface of P-type well regions 50, 150 are in contact with each other, and the N+ region 41, 141 can be formed to extend onto the surface of the P-type well regions 50, 150, on the contrary to each embodiment. The output protective device shown in FIGS. 2(a), 2(b) and 2(c) and the input protective device shown in FIGS. 3(a), 3(b) and 3(c) can be formed on the same semiconductor chip. Furthermore, P- and N-type conductivities in the embodiments can be reversed.

What is claimed is:

1. A complementary field effect transistor comprising a semiconductor substrate of one conductivity type, a first region of another conductivity type formed in said semiconductor substrate, a first type field effect transistor formed on said semiconductor substrate, a second type field effect transistor formed on said first region, each of said first and second types of field effect transistors having a source region, a drain region and a channel region located therebetween, gate electrodes formed on said channel regions of said first and second type field effect transistors through an insulating film, a second region of said one conductivity type having a high impurity concentration, said second region being formed in the surface area of said semiconductor substrate, said second region having a side which comes into contact with said drain region of said first type field effect transistor to form a first diode therebetween, a third region of said other conductivity type having a high impurity concentration, said third region being formed in the surface area of said first region to come in contact with said drain region of said second type field effect transistor to form a second diode therebetween, said second region and said third region being in contact with each other to form a third diode therebetween an output wiring layer connecting the drain regions of said first type and second type field effect transistors, an output electrode pad connected to said output wiring layer, a first power terminal connected to the surface area of said semiconductor substrate at a location that is on one side of said first region which is opposite the side of said first region where said first diode is formed, a second power terminal connected to the surface area of said first region, said first and second diodes being connected in series between said first and second power terminals, said third diode being connected between said first and second power terminals in parallel with the series connection of said first and second diodes, a fourth region of said other conductivity type having an elongated shape to provide a resistor region formed on the surface of said semiconductor substrate to come into contact with said second region to form a fourth diode therebetween, a fifth region of said one conductivity type formed on the surface of said first region to come into contact with said third region to form a fifth diode therebetween, said fourth and fifth diodes being connected in series between said first and second power terminals, an input wiring layer connecting one end of said fourth region and said fifth region, an input electrode pad connected to said input wiring layer, and an additional wiring layer connected to the other end of said fourth region and further connected in common to said gate electrodes of said first and second type field effect transistors.

* * * * *